United States Patent [19]

Stecher

[11] Patent Number: 5,287,755
[45] Date of Patent: Feb. 22, 1994

[54] PROCESS AND APPARATUS FOR VERIFYING THE CUT-OFF TORQUE OF AN ACTUATOR

[75] Inventor: Willi Stecher, Lauf, Fed. Rep. of Germany

[73] Assignee: Siemens Aktiengesellschaft, Munich, Fed. Rep. of Germany

[21] Appl. No.: 898,487

[22] Filed: Jun. 15, 1992

[30] Foreign Application Priority Data

Dec. 14, 1989 [EP] European Pat. Off. ........ 89123148.2

[51] Int. Cl.⁵ .............................................. G01L 5/24
[52] U.S. Cl. .................................. 73/862.23; 73/118.1
[58] Field of Search ............. 73/862.12, 118.1, 862.13, 73/862.23

[56] References Cited

U.S. PATENT DOCUMENTS 4,787,245 11/1988 Anderson et al. ............ 73/862.23 X

FOREIGN PATENT DOCUMENTS 1200571 9/1965 Fed. Rep. of Germany .

Primary Examiner—Jerry W. Myracle
Attorney, Agent, or Firm—Herbert L. Lerner; Laurence A. Greenberg

[57] ABSTRACT

An actuator has a driven shaft for an armature, a final torque switch and at least one electric lead. A process for verifying the cutoff torque of an actuator of an armature includes lifting the actuator away from the armature while keeping at least one electric lead connected to the actuator, connecting a torque measuring shaft and a brake connected to the torque measuring shaft to the driven shaft of the actuator, operating the actuator in the immediate vicinity of the armature and then braking the actuator until response of the final torque switch to ascertain a cutoff torque, and comparing the cutoff torque with a set-point cutoff torque. An apparatus for verifying the turnoff torque of an actuator of an armature includes a torque measuring shaft and a brake being connected to each other. Either the torque measuring shaft or the brake is connected to the driven shaft of the actuator in the immediate vicinity of the armature with the actuator being separated from the armature and with the at least one electric lead being connected to the actuator.

12 Claims, 1 Drawing Sheet

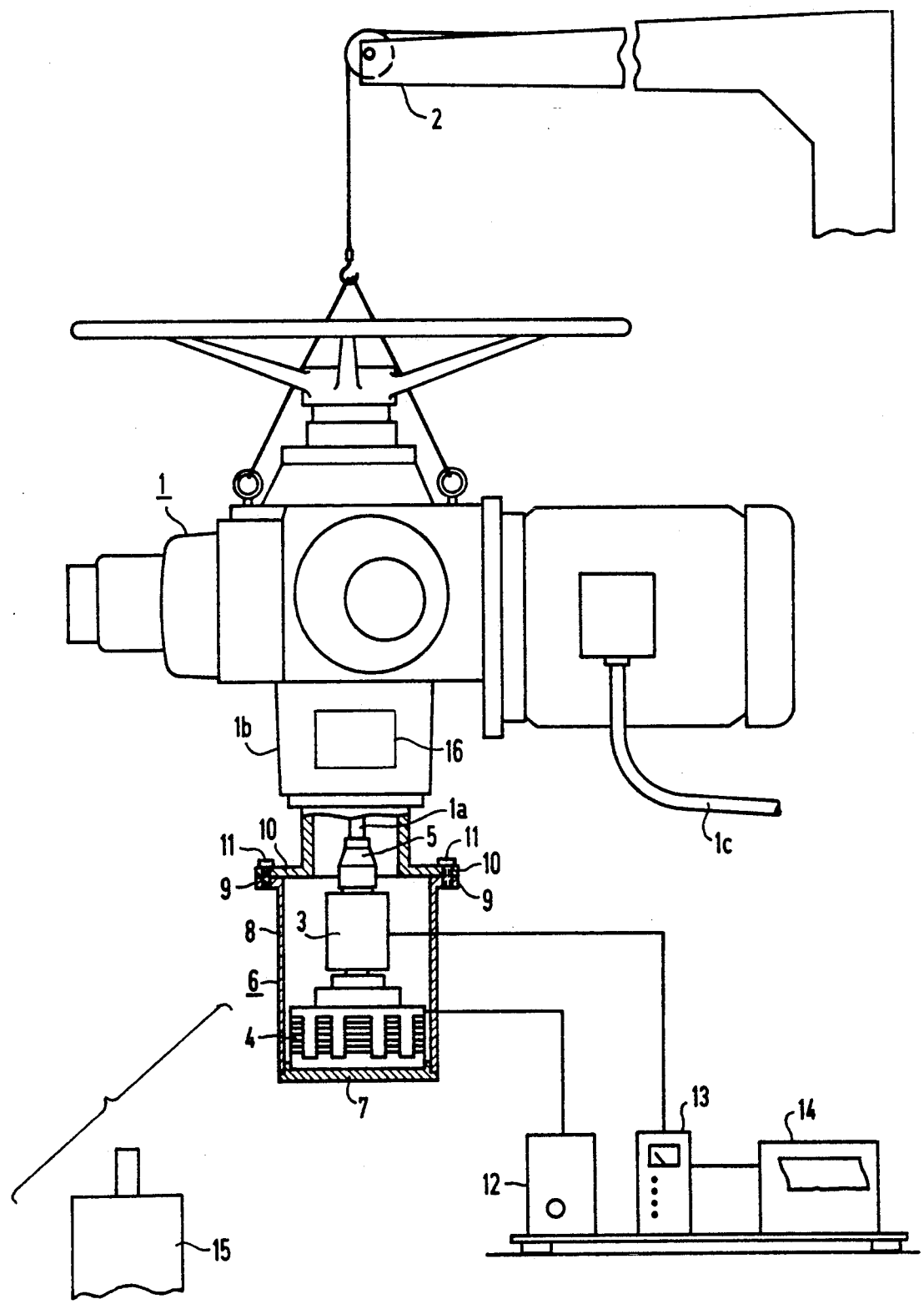

PROCESS AND APPARATUS FOR VERIFYING THE CUT-OFF TORQUE OF AN ACTUATOR

CROSS-REFERENCE TO RELATED APPLICATION

This application is a Continuation of International Application Ser. No. PCT/EP90/02092, filed Dec. 4, 1990.

The invention relates to a process and an apparatus for verifying the cut-off torque of an actuator of an armature, which has a driven shaft for the armature and a final torque switch.

In order to verify the functional capability of an armature, it is also necessary to check its actuator at certain time intervals. Care must be taken to ensure that the cutoff torque of the actuator meets given requirements.

Thus far, stationary test benches have always been used for verifying and adjusting the cutoff torque of an actuator. However, because of their weight, the stationary test benches cannot be moved from place to place. The mass of such a test bench is between 100 kg and 200 kg. In order to provide verification, the actuator is therefore taken off the armature, and the supply leads are removed. The verification of the cutoff torque is then performed on the stationary test bench, which as a rule is in some room in the shop. Once the work has been completed, which may also include regulating the cutoff torque, the actuator is returned to the armature. The actuator is joined to the armature there, and the electric connecting leads are connected to the actuator.

An actuator torque verification apparatus, which has such a stationary test bench, is known from German Published, Prosecuted Application DE-AS 1 200 571. A specimen to be tested, which may be an actuator of an armature, is verified there. Since the test bench is relatively far away from where the specimen is used, all of the leads that terminate at the specimen or begin there must be removed. The specimen is then driven during the testing process by a separate machine which is provided for that purpose.

Such a verification of an actuator is very time-consuming. During the entire period of time in which the actuator is not on the armature, the armature cannot be driven. That limits the operable time of the system of which the armature is a part. Such a process may entail major off-line costs, particularly in nuclear power plants.

It is accordingly an object of the invention to provide a process and an apparatus for verifying the cut-off torque of an actuator, which overcome the hereinafore-mentioned disadvantages of the heretofore-known methods and devices of this general type, which works reliably and which can be carried out so quickly that the off-line periods of the armature and thus of the entire plant are markedly shorter than in previous conventional testing processes and devices. It should as a result be possible to check a plurality of actuators during one typical off-line period of the plant.

With the foregoing and other objects in view there is provided, in accordance with the invention, a process for verifying the cutoff torque of an actuator of an armature, the actuator having a driven shaft for the armature, a final torque switch and at least one electric lead terminating or beginning at the actuator, which comprises lifting the actuator away from the armature while keeping at least one electric lead connected to the actuator, connecting a torque measuring shaft and a brake connected to the torque measuring shaft to the driven shaft of the actuator, operating the actuator in the immediate vicinity of the armature and then braking the actuator until response of the final torque switch, and comparing a cutoff torque with a set-point cutoff torque.

In accordance with another mode of the invention, there is provided a process which comprises measuring and recording a course of the torque until the final torque switch responds.

Additional information on the condition of the actuator can be inferred from this process. Moreover, ascertaining the cutoff torque is facilitated by continuous monitoring of the torque. The set-point cut-off torque may have been ascertained beforehand by computer. If the cut-off torque that is ascertained deviates from the set-point cutoff torque, the cutoff torque can be readjusted.

The actuator, which is separated from the armature, can continue to be supplied through uninterrupted electric leads. Accordingly, an electric motor of the actuator does not need a separate voltage source during a verification procedure. An existing evaluation unit can also be used.

An advantage attained with the process according to the invention is that the actuator does not need to be completely removed from the armature, and that movement of the actuator to a test apparatus can be dispensed with. The testing of the actuator is done directly at the location of the armature, with the existing system wiring. As a result, reliable verification can be carried out in a very brief time. The off-line period of an armature for verification is therefore quite short, which results in relatively low off-line costs.

In accordance with a further mode of the invention, there is provided a process which comprises lifting the actuator from the armature, suspending the actuator from a hoisting tool, holding it there, and operating and checking the actuator according to the process of the invention, while keeping the actuator suspended. The checking is accordingly done while the actuator is suspended from the hoisting tool. The check can be completed within a very short time in this way.

In accordance with an added mode of the invention, there is provided a process which comprises lifting the actuator from the armature, positioning the actuator with the driven shaft pointing upward and operating the actuator. This has the advantage of ensuring that the actuator remains in a stable position during the testing procedure.

In both cases, the existing wiring of the actuator remains unaltered.

With the objects of the invention in view, there is also provided an apparatus for verifying the turnoff torque of an actuator of an armature, the actuator having a driven shaft for the armature, a final torque switch and at least one electric lead terminating or beginning at the actuator, comprising a torque measuring shaft component and a brake component being connected to each other, one of the components being connected to the driven shaft of the actuator in the immediate vicinity of the armature with the actuator being separated from the armature and with the at least one electric lead being connected to the actuator.

Both a torque measuring shaft and a brake are known devices that can be obtained on the market. The stated object is accordingly attained by furnishing a combination of a torque measuring shaft and a brake, which has devices for coupling it to the driven shaft of the actuator immediately after the actuator has been separated from the armature. An advantage that is attained with this apparatus is that the cutoff torque of an actuator can be verified away from a test bench, directly at the location of the armature. In comparison with a stationary test, the apparatus is low in weight. As mentioned above, on one hand, a previously conventional stationary test bench has a mass of 100 kg to 200 kg. The apparatus according to the invention, on the other hand, has a mass of only 30 kg. This has the additional advantage of permitting the apparatus to be carried from one site to another for use for verifying the cutoff torque.

In accordance with another feature of the invention, the brake is a multiple disk brake. Such multiple disk brakes are known. They are especially well-suited for braking a shaft.

In accordance with a further feature of the invention, the torque measuring shaft or the brake is joined either directly or through an adaptor to the driven shaft of the actuator.

In accordance with an added feature of the invention, the brake and the torque measuring shaft are surrounded by a housing having an opening, and the torque measuring shaft or the brake are connectable to the driven shaft of the actuator at the opening in the housing. On one hand, through the use of such a housing, the brake and the torque measuring shaft are protected against external influences. On the other hand, an advantage is attained which is that the apparatus required for verifying the cutoff torque of the actuator is easily manipulated.

In accordance with an additional feature of the invention, the housing includes a base plate facing the opening, side walls disposed on the base plate, and a flange surrounding the opening and being placed against the housing of the actuator, the housing for the combination torque measuring shaft and brake being secured by the flange to the housing of the actuator, with simple connections such as screws. The housing of the combination can be equally quickly removed from the actuator again. Other fasteners are also possible besides screw connections. Attachment of the housing of the combination is made easier if the housing of the actuator provides suitable devices for fastening the housing that contains the torque measuring shaft and the brake. The devices on the actuator housing may be those devices that serve to keep the actuator locked on the armature during operation.

The advantage attained with the housing for the combination is that the combination torque measuring shaft and brake, which is needed to verify the cutoff torque of the actuator, can be easily manipulated and can be rapidly connected to an actuator and quickly detached from it again. This further shortens the down time of the armature needed for verification.

In accordance with yet another feature of the invention, the side walls of the housing of the combination are constructed as a pipe. This provides an especially simple, economical construction of the housing.

In accordance with yet a further feature of the invention, the brake is connected to a voltage transducer for supplying energy.

In accordance with a concomitant feature of the invention, the torque measuring shaft communicates with an evaluation unit for recording and evaluating the torque course. At least the voltage transducer and possibly the evaluation unit as well, may be already existing devices associated with the system of which the armature is a part.

With the process and the apparatus of the invention, a particular advantage is attained which is that solely with known, commercially available devices, namely a torque measuring shaft and a brake, the cutoff torque of the actuator of an armature can be verified quickly and reliably with little engineering effort or expense, directly at the location of the armature. The actuator need not be taken to some room in the shop, and all of the incoming and outgoing electric leads of the actuator can even be kept during the verification. Due to its low weight, the apparatus can be used at various locations within a short period of time. Moreover, another advantage which is attained is that the system wiring can be used for the verification, and the triggering can also be done by an existing control unit of the armature.

Other features which are considered as characteristic for the invention are set forth in the appended claims.

Although the invention is illustrated and described herein as embodied in a process and an apparatus for verifying the cut-off torque of an actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a fragmentary, diagrammatic, partly brokenaway and sectional elevational view of an actuator which is connected to an apparatus for verifying a cutoff torque.

Referring now to the single FIGURE of the drawing in detail, it is seen that in order to verify a cutoff torque, an actuator 1, which has previously been separated from an armature 15, is suspended from a hoisting tool 2. System wiring of the actuator 1 connecting it to the armature 15 and to other components, in particular an incoming lead 1c for a motor of the actuator 1, is not interrupted in the process. At a point where the actuator 1 is connected to the armature during operation, namely at a driven shaft 1a, a combination of a torque measuring shaft component 3 and a brake 4 is connected to the actuator 1. The torque measuring shaft component 3 is connected to the driven shaft 1a through an adaptor 5 and it in turn communicates with the brake 4. Although the torque measuring shaft component 3 and the brake 4 are connected to each other, either the torque measuring shaft component 3 or the brake 4 may be connected to the driven shaft 1a of the actuator 1. The combination of the adaptor 5, the torque measuring component shaft 3 and brake 4 is disposed in a component housing 6. The housing 6 includes a base plate 7, a pipe 8 disposed on the base plate 7 and a flange 9 formed onto the pipe. The flange 9 contacts suitable formed-on protrusions 10 on an actuator housing 1b of the actuator There the housing 6 is secured by fasteners, such as screws 11. The housing 6 may be formed of aluminum, for instance. The brake 4 may be a commercially available multiple disk brake, for example. The torque measuring shaft component 3 is also a commercially available component. The brake 4 is connected to a voltage transducer or transmitter 12. The torque measuring shaft component 3 communicates through an amplifier 13 with an evaluation unit 14 that is equipped with a plotter.

In order to verify the cutoff torque of the actuator 1 and the driven shaft 1a, the actuator 1 is removed from the armature 15. All of the electrical connections of the actuator 1 to other components can then be maintained. While the actuator 1 is suspended from a hoisting tool 2, for instance, the combination of the torque measuring shaft component 3 and the brake 4 is connected to the driven shaft 1a of the actuator 1. The actuator 1 is then set in motion through the usual operating system. This is possible since neither a power cable nor a control cable needs to be disconnected from the actuator 1. After the triggering of the actuator 1, braking is effected by the brake 4. The course of the torque in this braking procedure is detected by the torque measuring shaft component 3 and recorded and evaluated in the evaluation unit 14. The course of the torque is monitored until the actuator 1 is switched off by a known final torque switch 16 integrated with the actuator 1.

The process described above can be carried out with the aforementioned apparatus in the vicinity of the armature and leads connecting the actuator 1 to other components, in particular the power supply of the actuator 1, need not be interrupted. Verification of the cutoff torque of the actuator 1 can be carried out in a very short time. The necessary down time of the armature and thus of some larger system or plant, such as a power plant, is thus quite short.

I claim:

1. A process for verifying the cutoff torque of an actuator of an armature, the actuator having a driven shaft for the armature, a final torque switch and at least one electric lead, which comprises lifting the actuator away from the armature while keeping at least one electric lead connected to the actuator, connecting a torque measuring shaft and a brake connected to the torque measuring shaft to the driven shaft of the actuator, operating the actuator in the immediate vicinity of the armature and then braking the actuator until response of the final torque switch to ascertain a cutoff torque, and comparing the cutoff torque with a setpoint cutoff torque.

2. The process according to claim 1, which comprises measuring and recording a course of the torque until response of the final torque switch.

3. The process according to claim 1, which comprises lifting the actuator from the armature and suspending the actuator from a hoisting tool, and operating the actuator while keeping the actuator suspended.

4. The process according to claim 1, which comprises lifting the actuator from the armature and positioning the actuator with the driven shaft pointing upward while operating the actuator.

5. An apparatus for verifying the turnoff torque of an actuator of an armature, the actuator having a driven shaft for the armature, a final torque switch and at least one electric lead, comprising a torque measuring shaft component and a brake component being connected to each other, one of said components being connected to the driven shaft of the actuator in the immediate vicinity of the armature with the actuator being separated from the armature and with the at least one electric lead being connected to the actuator.

6. The apparatus according to claim 5, wherein said brake component is a multiple disk brake.

7. The apparatus according to claim 5, including an adaptor connecting said one component to the driven shaft.

8. The apparatus according to claim 5, including a component housing surrounding said components and having an opening formed therein through which said one component is connected to the driven shaft of the actuator.

9. The apparatus according to claim 8, wherein the actuator has an actuator housing, and said component housing includes a base plate facing said opening, side walls disposed on said base plate, and a flange being formed onto said side walls and surrounding said opening for connection to the actuator housing.

10. The apparatus according to claim 9, wherein said side walls are formed by a pipe.

11. The apparatus according to claim 5, including a voltage transducer communicating with said brake component.

12. The apparatus according to claim 5, including an evaluation unit communicating with said torque measuring shaft component.

* * * * *